United States Patent [19]

Huebner

[11] Patent Number: 4,980,316

[45] Date of Patent: Dec. 25, 1990

[54] METHOD FOR PRODUCING A RESIST STRUCTURE ON A SEMICONDUCTOR

[75] Inventor: Holger Huebner, Baldham, Fed. Rep. of Germany

[73] Assignee: Siemens Aktiengesellschaft, Berlin and Munich, Fed. Rep. of Germany

[21] Appl. No.: 385,670

[22] Filed: Jul. 26, 1989

[30] Foreign Application Priority Data

Jul. 20, 1988 [DE] Fed. Rep. of Germany ....... 3825729

[51] Int. Cl.$^5$ .......................................... H01L 21/465
[52] U.S. Cl. ................... 437/228; 437/981; 437/229
[58] Field of Search ............... 437/981, 228, 947, 235, 437/225, 229

[56] References Cited

U.S. PATENT DOCUMENTS

| | | | |
|---|---|---|---|
| 4,372,034 | 2/1983 | Bohr | 437/228 |
| 4,440,804 | 4/1984 | Milgram | 437/228 |
| 4,495,220 | 1/1985 | Wolf et al. | 437/228 |
| 4,522,681 | 6/1985 | Gorowitz et al. | 156/643 |
| 4,523,976 | 6/1985 | Bukhman | 437/187 |
| 4,560,436 | 12/1985 | Bukhman et al. | 437/229 |

FOREIGN PATENT DOCUMENTS 0174945 7/1987 Japan ................ 437/981
0213930 12/1988 Japan ................ 437/981

OTHER PUBLICATIONS

"VLSI Fabrication Principles", Sorab K. Ghandhi, 1983, pp. 499-510.

Primary Examiner—Brian E. Hearn
Assistant Examiner—Trung Dang
Attorney, Agent, or Firm—Hill, Van Santen, Steadman & Simpson

[57] ABSTRACT

A method for producing a resist structure on a semiconductor material which has an opening tapering towards the semiconductor material is provided. This method can be used, for example, for the manufacturing of T-gate metallizations in a field effect transistor. In this method, a thin, upper resist layer is structured, and the structure is transferred onto a silicon nitride layer. The structure is then transferred into a thickly applied resist while widening the upper part of the etching profile. The method is accomplished by a succession of anisotropic and isotropic dry etching steps.

15 Claims, 1 Drawing Sheet

METHOD FOR PRODUCING A RESIST STRUCTURE ON A SEMICONDUCTOR

BACKGROUND OF THE INVENTION

The present invention relates to a method for producing a resist structure on a semiconductor material which has an opening tapering towards the semiconductor material.

With respect to semiconductor components there is an ever increasing need to apply a metallization to the surface of a semiconductor layer structure, whereby the contact area between the semiconductor material and the metal is optimally small, while at the same time, an optimally great amount of metal should be applied so as to reduce the lead resistance. These types of metallizations, for example, are required in the manufacture of field effect transistors for operation in ultra-high frequency ranges. Felt or T-gates, as they are referred to in the industry, are produced in order to be able to provide extremely small gate lengths, particularly in the sub- $\mu$m range, with a metallization which has an optimally large cross-section. The felt or T-gates are produced by vapor-depositing a mushroom-shaped resist structure with metal. However, in this process, there is a problem of structuring a resist layer with the required profile.

A typical method for structuring the resist on the semiconductor material is by successively applying a sequence of resist layers. In this process, each layer is individually exposed and developed. A disadvantage of this method is that it requires a technically involved sequence of exposure steps which need to be adjusted relative to the other steps. The difficulties which result from having to make all these adjustments can be avoided by applying a sequence of resist layers that have different sensitivities. These layers are then exposed and developed simultaneously. The mushroom-shaped structure of the opening results because the upper, more sensitive layers are increasingly overexposed. However, the desired short length of the contacting surface (below 0.5 $\mu$m), does not occur because the structure of the resist layers is so thick. When the semiconductor layer structure does not have a planar surface, it is impossible to apply the first resist so that it has a sufficient thinness. The first method described above is not usable in cases where there is a non-planar semiconductor layer structure.

SUMMARY OF THE INVENTION

The present invention provides a method for the production of resist structures on semiconductor material with an opening tapering towards the semiconductor material. By utilizing the method of the present invention, involved adjustment should not be necessary. Moreover, the method of the present invention should be usable even for a topography that is not planar. It should thus be possible to produce openings in the resist coating that will expose on the surface of the semiconductor layer structure regions which have dimensions that are situated in the sub- $\mu$m area.

To this end, the present invention provides a method for producing a resist structure on a semiconductor material having an opening tapering towards a semiconductor material comprising the steps of:

applying a resist on top of the semiconductor material, a stop layer on the resist, and an upper resist layer on the stop layer;

producing a window in the upper resist layer having the dimensions of the base of the opening to be produced;

transferring the window in the stop layer, by anisotropic dry etching, into the resist, so as to have an etched out region in the resist and then, removing the upper resist layer from the top of the stop layer;

widening, by isotropic dry etching, the etched-out region of the resist to a prescribed depth;

producing a projection of the window in the layer part of the resist which is facing towards the semiconductor material, by anisotropic dry etching, to the boundary surface of the semiconductor material; and removing the stop layer.

In an embodiment, the resist is applied in a thickness of approximately 600 nm to about 1000 nm.

In an embodiment, the stop layer is applied in a thickness of approximately 20 nm to about 40 nm.

In an embodiment, the upper resist layer is applied in a thickness of approximately 200 nm to about 400 nm.

In an embodiment, the semiconductor material is essentially GaAs.

In an embodiment, the upper resist layer is polymethylmethacrylate.

In an embodiment, the stop layer is silicon nitride.

In an embodiment, a base layer of silicon nitride is applied on the surface of the semiconductor material, and a resist is applied on top of the base layer; the projection of the window made in the base of the resist is continued down through the base layer of silicon nitride to the surface of the semiconductor material by anisotropic dry etching.

Additional features and advantages of the present invention are described in, and will be apparent from, the detailed description of the present invention and from the drawings.

DETAILED DESCRIPTION OF THE INVENTION

The method of the present invention produces a resist structure on a semiconductor material which has an opening which tapers towards the semiconductor material. The method achieves such a structure without involved adjustments and can be used on topography that is not planar. Utilizing the method, openings can be produced in the resist coating that expose the surface of the semiconductor layer structure in the sub-micron region. The method achieves these advantages in that the desired profile shape of the resist layers is created by only having to use reactive ion etching through a single, thick resist layer.

Figure 1:
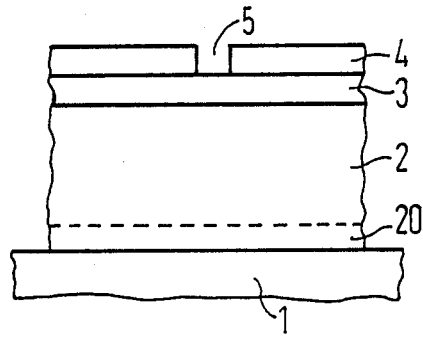
FIG. 1 illustrates a cross-sectional view depicting a semiconductor body with previously applied resist layers and a window successively being etched through the different layers pursuant to a step of the method of the present invention.

Referring to FIG. 1, pursuant to an embodiment of the method of the present invention, a resist 2 is applied onto the surface of a semiconductor material 1. Preferably, the resist 2 is applied at a thickness in the range of approximately 600 nm to about 1000 nm.

Next, a stop layer 3, which is etchable, is laid on top of the resist 2. The stop layer 3, for example, in an embodiment of the invention, can be silicon nitride ($Si_3N_4$) having a thickness of about 30 nm.

In the next step of the method, an upper resist layer 4 is applied. In an embodiment, polymethylmethacrylate, for example, can be used for the resist layer 4. This upper resist layer 4 is selectively etchable with respect to the stop layer 3.

In a fourth step of the method, the upper layer 4 is pre-structured. The pre-structuring, for example, in an embodiment, can be performed through electron beam lithography. This structure has dimensions which correspond to the region of the semiconductor surface which is to be exposed under the resist layer. For example, in a field effect transistor, this structure can have dimensions that correspond to the contact area located between the gate region and the gate metallization. The fourth step produces a window 5 in the upper resist layer 4, as illustrated in FIG. 1.

Figure 2:
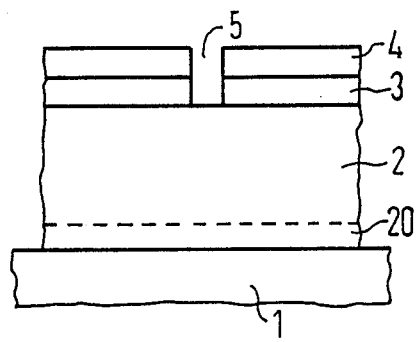
FIG. 2 illustrates a cross-sectional view of the semiconductor body after a further step of the method of the present invention.

FIG. 2 illustrates a fifth step of the method of the present invention, wherein the window 5 is etched farther into the stop layer 3. This etching is accomplished through the use of anisotropic dry etching, for example, with $CF_4$ plasma. Because of the anisotropy of this etching step, the structure of window 5 is identically transferred into the stop layer 3. FIG. 2 illustrates the results of this step of the process.

Figure 3:
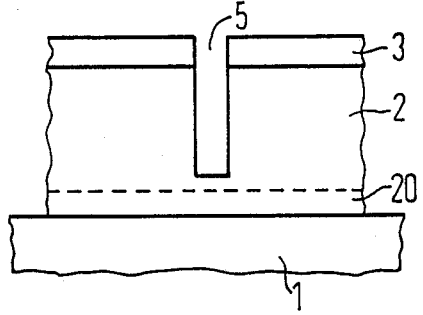
FIG. 3 illustrates a cross-sectional view of the semiconductor body after a further step of the method of the present invention.

Referring now to FIG. 3, the structure formed by the window 5 is transferred deeper, into the resist 2, by anisotropic dry etching. At exactly the same time, the upper resist layer 4 is simultaneously removed. $O_2$ plasma, for example, that is fully compatible with $CF_4$ plasma can be used in this step for the dry etching. If the two plasmas are compatible, the transition between the fifth and sixth step can be easily and quickly accomplished by simply switching the gas leads.

Figure 4:
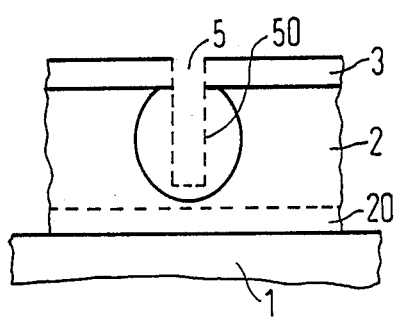
FIG. 4 illustrates a cross-sectional view of a semiconductor body depicting a method step for creating a mushroom-shaped expansion of the etched opening.

FIG. 4 illustrates a seventh step of the method of the present invention. In this step, the etched out region of resist 2 is widened by isotropic dry etching. The broken lines 50 in FIG. 4 show where the walls of the original etched trench were before the widening occurred. The widening of the resist 2 should be performed so as to form upper edges suitable for use in lift-off methods.

Figure 5:
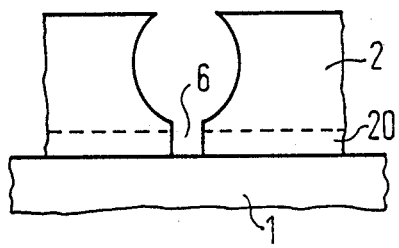
FIG. 5 illustrates a cross-sectional view of a semiconductor depicting a further method step for creating a mushroom-shaped expansion of the etched opening.

An eighth step of the method is illustrated in FIG. 5. Anisotropic dry etching is used to etch more deeply into the resist 2. This produces a projection 6 of the window in the part of the resist 2 which is facing towards the semiconductor body 1. As FIG. 5 illustrates, this etching exposes the surface of the semiconductor material. The exposed region of the semiconductor material has the exact same dimensions as the structure which was defined in the fourth step by the etching in the upper resist layer. FIG. 5 also displays a ninth step wherein the stop layer 3 is removed.

Figure 6:
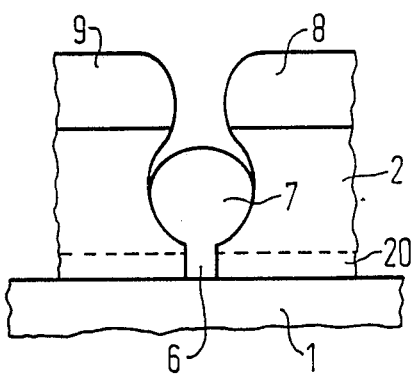
FIG. 6 illustrates a cross-sectional view of a semiconductor body depicting the resist layer produced by the method of the present invention after the vapor-deposition of metal.

A structured resist layer produced by the steps set forth above can be vapor-deposited with metal, as FIG. 6 illustrates. The first part 7 of the metallization remains on the semiconductor body 1. A second part 8 and a third part 9 of the metallizations which are on the resist 2, are removed with a lift-off technique. Gate metallizations, which have a mushroom-shaped cross-section and an adequately short gate length, are obtained by the above procedure.

The semiconductor material, in an embodiment, can be essentially GaAs. In an embodiment, the resist is HPR 204 obtained from Olin Hunt.

In a further embodiment of the method of the present invention, a silicon nitride base layer 20 can be applied onto the semiconductor material. Each of FIGS. 1-6 illustrates this in a dotted line in each of the figures. This step can be performed before the first step. The base layer 20, for example, can be used in the manufacture of a semiconductor layer with a semiconductor body, for example, for the curing of implantation. In an embodiment, this base layer 20 can have a thickness of about 50 nm.

In a ninth step, anisotropic etching is used to etch a projection 6 of the window through the base layer 20 to the surface of the semiconductor material 1. In an embodiment, the etching in this step can also proceed via wet-chemically, since the structuring of the lower layer portion of the resist 2 serves as an etching mask. In a further embodiment of this method, isotropic etching, as opposed to anisotropic etching, can be used in the sixth step of the method. The upper resist layer 4 is then removed in the sixth step (as opposed to removal in the seventh step as in the embodiment of the method previously discussed). By using isotropic etching in the sixth step, the seventh step's widening of the etched out region is already co-implemented.

There are many advantages achieved by using the method of the present invention. One of the advantages of the method of the present invention is that it will level the topography of a highly structured (non-planar) semiconductor surface. Because the resist 2 can be applied with great thickness, the thin upper resist layer 4 can be planarly applied and can, for example, be easily structured with electron beam lithography. A structure width of below 200 nm can then be achieved. Previously, a structure width of below 200 nm was not possible when the resist layer had to be structured in an undefined thickness in the deeper regions of the non-planar semiconductor surface. Another advantage of the method of the present invention is that the technical possibilities for processing a three-layer structure can be easy to implement when using the method of the present invention.

A further advantage of the method of the present invention is that the structure of the upper resist layer 4 does not need to be realigned as it is transferred down to the surface of the semiconductor material by anisotropic etching since it is self-aligning. Further, the structure can be transferred without a measurable difference in dimensions occurring during the transfer. This is due to the high selectivity of the oxygen plasma between the silicon nitride used for the stop layer 3 and the resist 2. The widening of the etched out area in resist 2 is accomplished solely by changing the etching parameters, e.g., pressure, mass flow, and bias voltage.

Another advantage of the method of the present invention is that the shapes of the cross-sections of the opening to be produced in resist 2 can be selected within broad limits. The method of the present invention has broad selectivity because the inventive sequence of isotropic etching steps can be varied in duration and in sequence.

A still further advantage of the method of the present invention is that there is only a single exposure and development step. Additionally, the transition from the fifth to the sixth step in this method can be made without interruption and in one reaction chamber. Hence, it is possible to etch the stop layer 3 in the fifth step and the resist 2 in the sixth step without interruption, because of the complete compatibility of the $CF_4$ plasma and $O_2$ plasma. At the most, this procedure merely requires the switching of gas conduits. The ability to apply a silicon nitride base layer 20 adds another advantage. An example of where this base layer could be required is for the curing process of implantation. The base layer 20 can be etched through in the same manner as the structuring of resist 2 is done.

It should be understood that various changes and modifications to the presently preferred embodiments described herein will be apparent to those skilled in the art. Such changes and modifications can be made without departing from the spirit and the scope of the present invention and without diminishing its attendant advantages. It is therefore intended that such changes and modifications be covered by the appended claims.

I claim:

1. A method for producing a resist structure on a semiconductor material which comprises an opening tapering towards said semiconductor material comprising the steps of:
   (a) applying a resist on top of said semiconductor material;
   (b) applying a stop layer on top of said resist;
   (c) applying an upper resist layer on top of said stop layer;
   (d) producing a window in said upper resist layer having dimensions of the base of said opening to be produced;
   (e) transferring said window, by anisotropic dry etching, into said stop layer;
   (f) transferring said window in said stop layer into said resist, by anisotropic dry etching, forming an etched-out region in said resist and removing said upper resist layer, from the top of said stop layer;
   (g) widening, by isotropic dry etching, said etched-out region of said resist to a prescribed depth;
   (h) producing, by anisotropic dry etching, a projection of said window in a layer part of said resist, facing towards said semiconductor material, down to the boundary surface of said semiconductor material; and
   (i) removing said stop layer.

2. The method of claim 1 wherein the resist is applied in a thickness of approximately 600 nm to about 1000 nm.

3. The method of claim 1 wherein the stop layer is applied in a thickness of approximately 20 nm to about 40 nm.

4. The method of claim 1 wherein the upper resist layer is applied in a thickness of approximately 200 nm to about 400 nm.

5. The method of claim 1 wherein the semiconductor material is essentially GaAs.

6. The method of claim 1 wherein the upper resist layer is polymethylmethacrylate.

7. The method of claim 1 wherein the stop layer is on nitride.

8. A method for producing a resist structure on a semiconductor material which comprises an opening tapering towards said semiconductor material comprising the steps of:
   (a) applying a base layer of silicon nitride;
   (b) applying a resist on top of said base layer;
   (c) applying a stop layer on top of said resist;
   (d) applying an upper resist layer on top of said
   (e) producing a window in said upper resist layer having dimensions of the base of said opening to be produced;
   (f) transferring said window, by anisotropic dry etching, into said stop layer;
   (g) transferring said window in said stop layer into said resist, by anisotropic dry etching, thereby forming an etched-out region in said resist and removing said upper resist layer from the top of said stop layer;
   (h) widening, by isotropic dry etching, said etched-out region of said resist to a prescribed depth;
   (i) producing a projection, by anisotropic dry etching, of said window in a layer part of said resist which is facing towards said semiconductor material, down to the surface of the base layer;
   (j) continuing said projection of said window down through said base layer onto the surface of said semiconductor through additional anisotropic etching; and
   (k) removing said stop layer.

9. The method of claim 8 wherein the resist is applied in a thickness of approximately 600 nm to about 1000 nm.

10. The method of claim 8 wherein the stop layer is applied in a thickness of approximately 20 nm to about 40 nm.

11. The method of claim 8 wherein the upper resist layer is applied in a thickness of approximately 200 nm to about 400 nm.

12. The method of claim 8 wherein the semiconductor material is essentially GaAs.

13. The method of claim 8 wherein the upper resist layer is polymethylmethacrylate.

14. The method of claim 8 wherein the stop layer is silicon nitride.

15. The method of claim 8 wherein:
   the resist is applied in a thickness of approximately 600 nm to about 1000 nm;
   the stop layer is applied in a thickness of approximately 20 nm to about 40 nm; and the upper resist layer is applied in a thickness of approximately 200 nm to about 400 nm.

* * * * *